United States Patent [19]

Blumenau

[11] Patent Number: 5,506,510
[45] Date of Patent: Apr. 9, 1996

[54] ADAPTIVE ALIGNMENT PROBE FIXTURE FOR CIRCUIT BOARD TESTER

[75] Inventor: Steven M. Blumenau, Royalston, Mass.

[73] Assignee: GenRad, Inc., Concord, Mass.

[21] Appl. No.: 245,477

[22] Filed: May 18, 1994

[51] Int. Cl.$^6$ ................................................. G01R 31/02
[52] U.S. Cl. ........................... 324/754; 324/761; 324/149
[58] Field of Search ................................. 324/754, 761, 324/149

[56] References Cited

U.S. PATENT DOCUMENTS

| | | | |
|---|---|---|---|
| 4,352,061 | 9/1982 | Matrone | 324/754 |
| 4,465,972 | 8/1984 | Sokolich | 324/754 |
| 4,724,377 | 2/1988 | Maelzer et al. | 324/149 |

Primary Examiner—Kenneth A. Wieder
Assistant Examiner—Kourosh Cyrus Khosravi
Attorney, Agent, or Firm—Cesari and McKenna

[57] ABSTRACT

A probe fixture for an automatic circuit board tester has a high density array of probe pads. The array of probe pads are sized and spaced apart to ensure contact with all of the test points on the device under test (DUT). The width of the pads is made smaller than the known minimum separation of the test points, and the separation of the pads is made smaller than the known width of the test points. The pads are connected to remote contacts of the fixture. A multiplexer unit may be provided to connect the desired test circuits to different probe pads of the fixture. Using the multiplexer unit, a controller of the tester can individually test the relative connection status of each of the probes of the fixture. By comparing to the known test point layout of the DUT, the controller then determines which of the probe pads is in contact with which of the test points and proceeds with the desired test functions accordingly.

30 Claims, 5 Drawing Sheets

ADAPTIVE ALIGNMENT PROBE FIXTURE FOR CIRCUIT BOARD TESTER

BACKGROUND OF THE INVENTION

Circuit board test fixtures are devices which are used in testing electronic circuits, often referred to as "devices under test" (DUTs). The DUT is often a printed circuit board whose constituent components are to be tested. In use, the fixture generally holds and positions the DUT and establishes electrical interconnection between test equipment and test points or nodes on the DUT. The test equipment typically includes signal circuitry for generating selected excitation signals applied to the DUT test points through the fixture interconnections and for detecting or monitoring response signals therefrom as part of a manufacturer's quality assurance testing program or as a diagnostic procedure during circuit board repair and servicing.

One type of test fixture is the so-called "bed of nails" device which, as the name suggests, has an array of spring-loaded contact probes which support and make electrical contact with the DUT. The probes are mounted at fixed locations in an interface plate in registration with all desired test points on the circuit board. The other ends of the probes communicate electrically with the test signal circuitry. During testing, the DUT is disposed in the test fixture, which is typically placed within or equipped with a device for the application of pressure to make the requisite probe-to-DUT contacts.

Although known versions of such test fixtures are generally suitable for their intended purpose, certain inherent limitations have been identified. One such limitation stems from the fact that each different DUT will generally have test points arranged in a pattern unique to that DUT. For testing, the fixture's probes are arranged in the identical grid pattern. When there are many test points on the DUT which must be contacted by as many individual probes of the fixture, the fabrication of the probe fixture is complex and time-consuming. The interface plate has to be designed and manufactured, and all probes individually wired, specifically for the particular DUT. Of course, that probe fixture is then suitable only for testing boards having that particular layout. If any modification is made to the printed circuit board components or circuitry that necessitates a change in the location of its test points, the test fixture must be redesigned and often rebuilt to account for the change in the test point pattern. Then the probes must again be wired to the test circuitry.

In recent years, an additional concern has developed with regard to the design of probe fixtures. As the density of electronic components, particularly integrated circuits (ICs), has increased, the need for smaller and more-closely spaced test points has arisen. For example, it is not uncommon today to find surface-mounted devices (SMDs) which have individual leads spaced apart at a pitch of 25 mils (thousandths of an inch) or less. This has exacerbated the problem of properly fabricating a test fixture so that the relative positioning of the probes matches that of the test points of the DUT. In addition, when applied to the DUT, the fixture must be precisely aligned relative to the DUT to ensure that the probes make contact with the correct test points.

SUMMARY OF THE INVENTION

The probing technique of the present invention reduces alignment constraints and the frequency with which new fixtures need to be designed for new circuit-board types. This technique does not employ the conventional one-to-one relationship between the probe pads and device test points. Instead, the probe pads are spaced more densely than the test points. In particular, the probe pads are sized and spaced to adapt to different lateral positions. Thus, the board may first be brought into engagement with the fixture in a first position. The board may then be moved laterally relative to the fixture from the first position to a second position, in which a test point contacts a probe pad that it did not contact in the first position. However, the sizing and spacing of the probe pads ensures that each test point contacts at least one probe pad throughout the range between the two positions. The probe pads are also sized relative to the board such that no probe pad can contact two test points simultaneously in any possible relative lateral position of the DUT and the fixture.

In the preferred embodiment, each of the fixture's probe pads has a maximum width less than a predetermined minimum distance by which test points are known to be separated. This ensures that no probe pad contacts two test points simultaneously. The probe pads also are spaced apart from one another by a distance less than a known predetermined minimum test-point width to ensure that no test point can fall between two probe pads without contacting either one of them. This fixture structure results in the possibility that more than one probe pad will contact the same test point. However, each of the test points makes contact with at least one probe pad.

In a typical embodiment of the invention, a test side of the fixture has an array of remote contacts which are in electrical communication with the test circuitry. A plurality of probe conductors provide an electrical connection between the probe pads and the remote contacts.

In the preferred embodiment, the tester includes a switching matrix, typically a multiplexer unit, which selectively connects certain test circuits to certain probe pads, via the conductors of the fixture. The multiplexer unit is preferably external to the fixture, making switched connections between electrical contacts of the test circuitry and the remote contacts of the fixture. In determining which of the probe pads contact which of the test points, a controller, through control of the test circuits and switching matrix, can apply an ohmmeter circuit to adjacent pads to determine if a short circuit exists between them. Such a short circuit indicates that the pads are contacting the same test point. Once all of the short circuit relationships between all of the pads and the pads adjacent to them are determined, the controller may store the information in a memory unit and construct a map of which pads are connected to which test points. By comparing this with a map of expected test point locations, which may also be stored in the memory unit, the controller determines which of the probe pads are contacting the test points to which it needs access to test the DUT. The controller then sends the appropriate signals to the multiplexer unit and the test circuitry to make the appropriate connections between the test circuitry and the DUT test points.

DETAILED DESCRIPTION OF A PREFERRED EMBODIMENT

Figure 1:
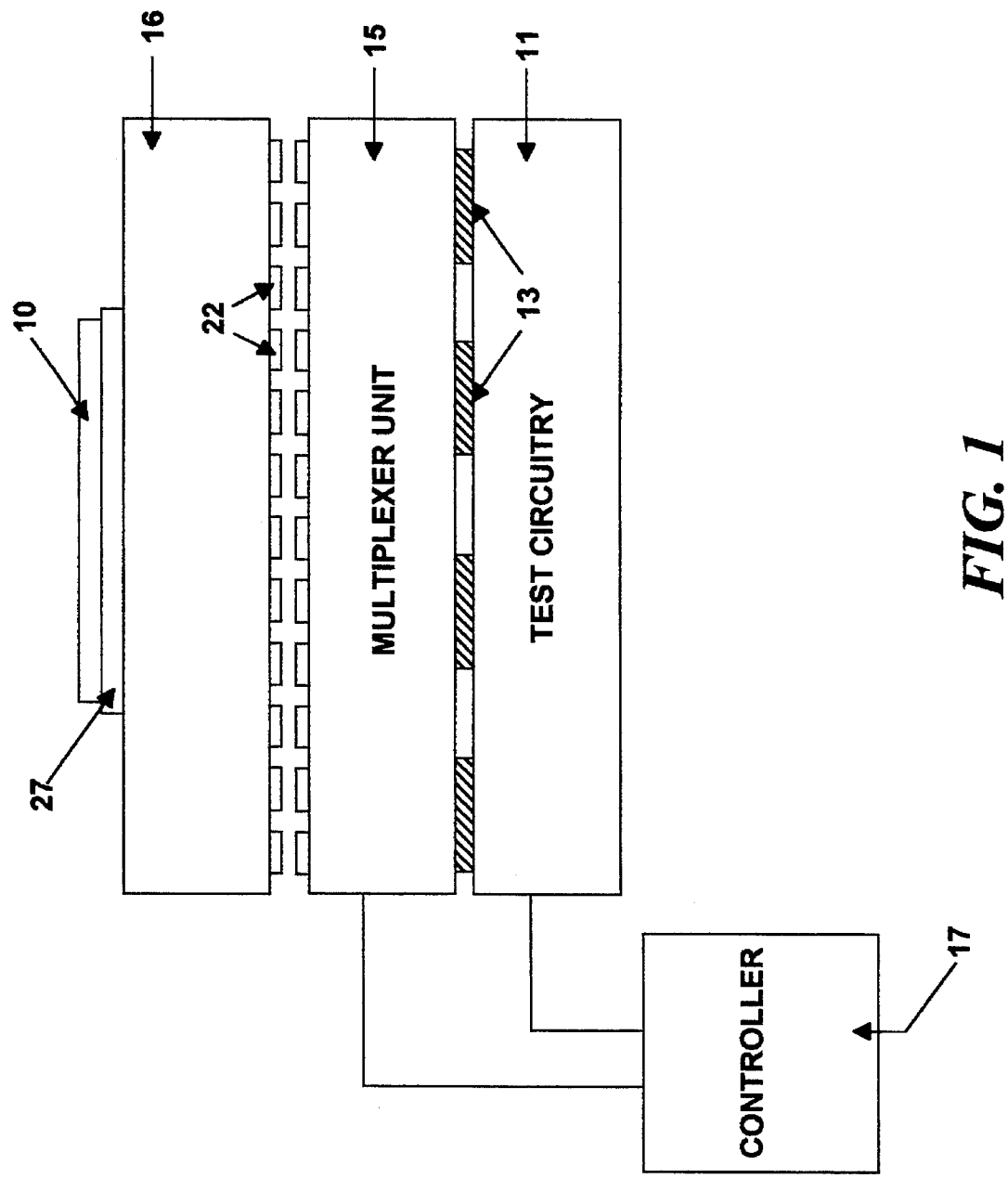
FIG. 1 shows an automatic circuit board tester using a probe fixture according to the present invention.

Shown in FIG. 1 is an automated circuit board tester according to the present invention. A DUT 10 has test points on its underside which must be contacted by the test equipment in order to conduct the necessary automated tests. The test circuitry 11 used to conduct the tests is shown generally in the figure, and may comprise a set of conventional test instruments, the selection of which may depend on the particular DUT circuits being tested. Electrical contact is made at a number of links 13 between the test circuitry 11 and a multiplexer unit 15. The multiplexer unit 15 is a switching matrix that responds to signals from a test controller 17, which might be a host computer or microprocessor, to make connection between the links 13 and the appropriate remote contacts 22.

For each test function, connection is made by the multiplexers between a particular test instrument and a particular set of remote contacts 22 on probe fixture 16. While the multiplexer unit 15 may be simply a one-to-one switching matrix (having the same number of connections on the test circuit side as on the probe fixture side), in the preferred embodiment it consists of multiplexed switches, or multiplexers. As is described more fully below, the probe fixture 16 provides multiple connection paths between the DUT 10 and the multiplexer unit 15, thus giving the test circuitry 11 access to the DUT 10.

Figure 2:
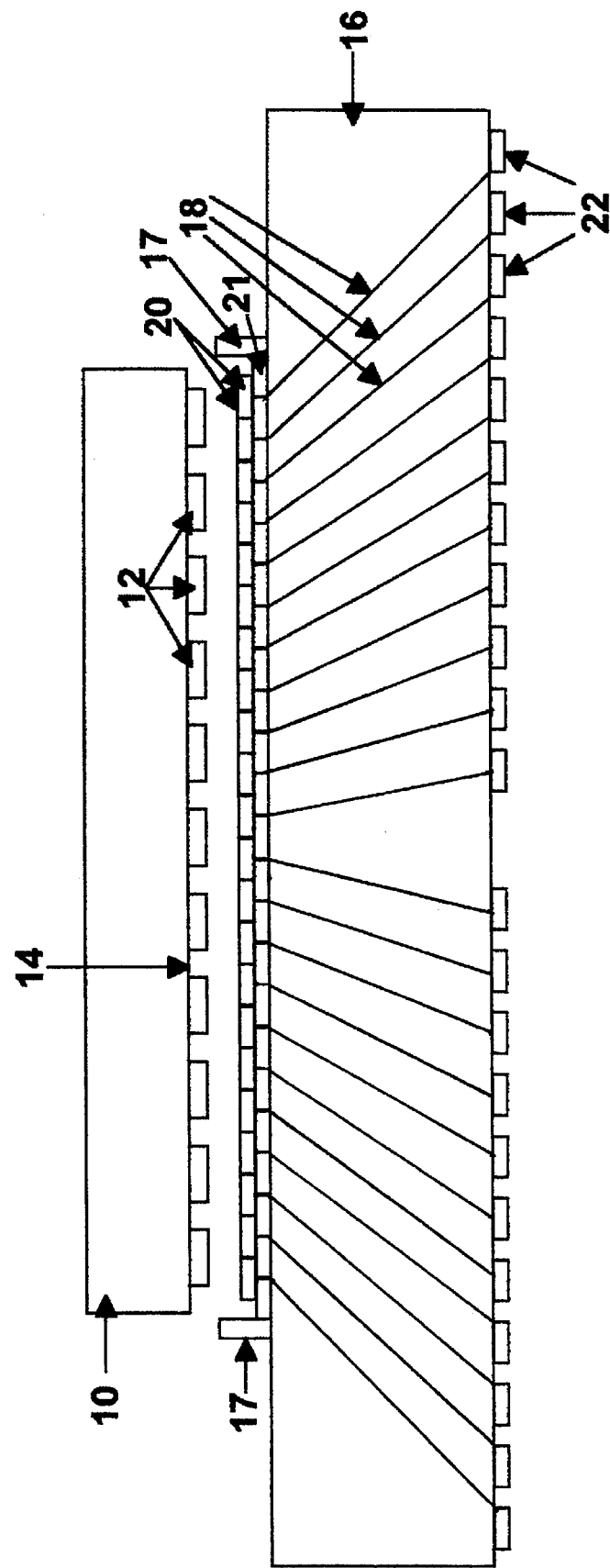
FIG. 2 is a cross section of the probe fixture of FIG. 1.

The probe fixture 16 is shown more clearly in the cross section of FIG. 2, along with DUT 10. The DUT 10 has a number of test points 12 located on a surface 14 to which electrical test circuitry must make contact as part of a quality control procedure or other test process. The pitch of the test points on the board is relatively fine, making proper registration with a conventional probe difficult. For example, the pitch of the test points appear to be distributed all over the surface 14 of DUT 10, the present invention applies to any distribution of test points on a single surface or, in some cases, on multiple surfaces.

Probe fixture 16 supports a plurality of individual probes 18. Each of the probes comprises a fine conductor which connects a probe pad 20 to a remote contact 22. On the multiplexer unit side of the fixture 16, the connections between remote contacts 22 and corresponding contacts on the multiplexer unit may be made in any conventional way.

On the DUT side of the fixture 16 are probe pads 20 which are preferably mounted to a flexible substrate 21 such as a polyimide or other material used in the manufacture of flexible circuit boards. The DUT 10 and the fixture 16 may be held together during testing by a conventional vacuum or other securing means. Although the substrate 21 is generally planar, its flexible nature allows probe pads 20 to flex toward the DUT 10 to ensure that each of the pads 20 contacts the DUT 10. This flexibility also causes the probe pads to slide or "wipe" across the surface of the test points to help remove oxide and depositions and thereby maintain good conductivity. A rubber gasket 27 is attached to the substrate in the preferred embodiment, and has a cut out portion in the shape of the DUT 10. Thus, the DUT 10 fits within the gasket 27 which thereby provides a rough alignment between the DUT test points and the probe pads 20. If a vacuum seal is used, the gasket 27 provides a surface surrounding the DUT 10 to help maintain the desired suction.

The probe pads 20 of the fixture are very small, relative to the test points, and are closely spaced together. For manufacturing ease, the probe pads and their corresponding conductors may be fabricated in groups, each group of probe pads being located on a different section of substrate. The different sections of substrate are then assembled together to form the finished substrate 21. In contrast, the remote contacts 22, in most embodiments of the invention, are more widely spaced apart. This allows them to be easily contacted by electrical test equipment. However, it should be recognized that it is not necessary that the remote contacts 22 have a wider spacing in order to accomplish the misalignment correction feature of the invention.

The probe pads 20 of the fixture 16 are spread out across the structure of the probe. FIG. 2 shows this spatial arrangement in only one dimension. However, as will be further described below, the fixture 16 typically has a two-dimensional array of probe pads 20 and an array of remote contacts 22 to which the pads are connected. In this embodiment, the pads 20 and remote contacts 22 are connected by probe conductors which fan out from one another away from the probe pad side of the fixture 16 to accommodate the increased pitch of the remote contacts 22. In other embodiments, the distance between adjacent probe wires may stay constant or decrease toward the remote contact side of the fixture 16.

For the purposes of this following description, the specifications for the "width" of the pads 20, the test points 12 and the contacts 22 applies for each of the two dimensions of the array. Similarly, the specifications for the "spacing" between adjacent pads 20, test points 12 or contacts 22 refers to their relative separation from one another in each of the two directions of the particular array in question. However, for the purpose of understanding the present invention, the discussion is limited to the direction shown in FIG. 2. This description is provided to demonstrate how the high density of probe pads 20 in the present embodiment provides compensation for the misalignment of the DUT 10 to the fixture 16.

Figure 3:
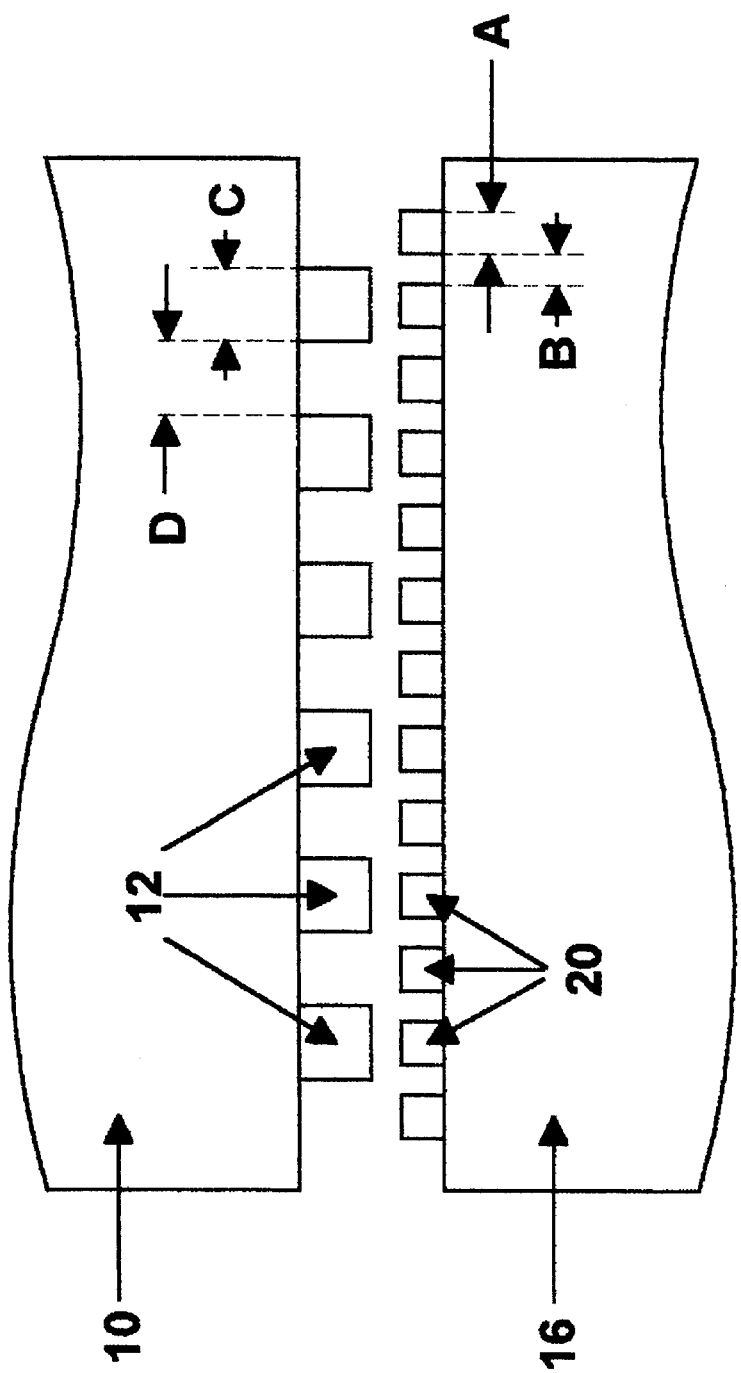
FIG. 3 is an isolated diagrammatic view of a section of the probe fixture and a device under test of FIG. 1.

FIG. 3 is an enlarged view of the probe pads 20 and the test points 12 of FIG. 2. The probe pads in this embodiment have a generally square shape, but for the purposes of the present invention the pads may have a different shape. However, for any pad shape the density of the pads must be sufficiently greater than that of the test points to satisfy the criteria that a test point will be contacted by at least one probe pad in any relative alignment of the DUT 10 and fixture 16, and that no pad can contact two test points simultaneously. Letters A, B, C and D are used in the figure to show different dimensions of the pads 20 and test points 12 which are relevant to the present invention. Width A of each probe pad 20 and distance B between the pads 20 are chosen relative to the dimensions of the test points 12 as follows.

Width A of each probe pad 20 is made smaller than the minimum distance D between test points 12. This ensures that no single probe pad 20 of the fixture 16 can contact two of the test points 12 simultaneously. Distance B between the probe pads 20 is made smaller than the minimum width C of each test point 12. This ensures that when the fixture is brought into engagement with the DUT 10, at least one of the probe pads 20 is in contact with each test point 12. It should be apparent that some of the pads 20 may be in between two test points 12, not contacting either one, while some test points 12 may be contacted by two or more pads 20.

Because of this arrangement, each electrical signal on a test point 12 of the DUT 10 is present on at least one of the remote contacts 22 when the fixture 16 is brought into engagement with the DUT 10. Some of the contacts 22 might have a signal from the same test point 12, while others may carry no signal at all. The spacing of the probe pads 20 as described in FIG. 3 ensures that, despite any lateral misalignment between the fixture 16 and the DUT 10, each of the test point signals can be communicated from the test points 12 to the probe remote contacts 22.

Figure 4:
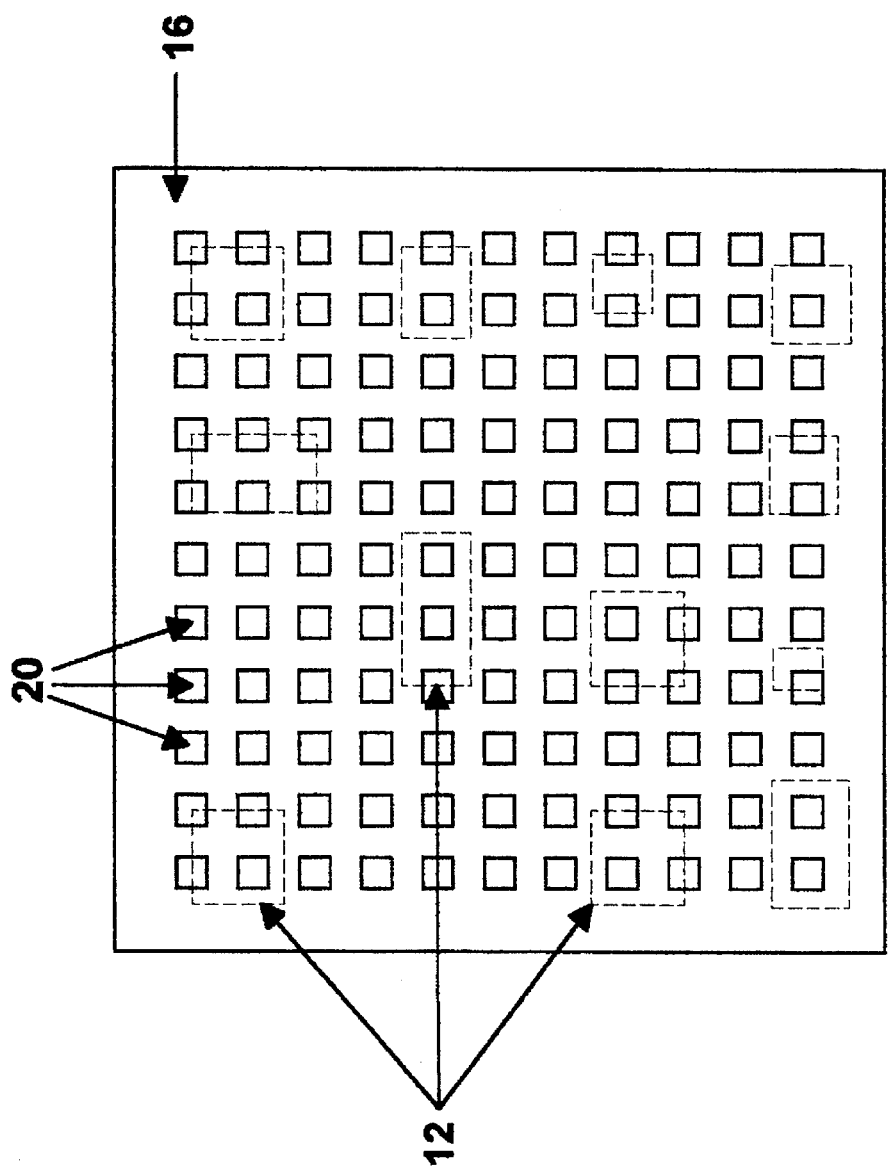
FIG. 4 is a view of a probing surface of the probe fixture of FIG. 1.

FIG. 4 shows one example of how an array of probe pads 20 is organized on fixture 16. The broken lines in the figure indicate where the test points 12 might contact the pads 20 when the fixture is brought into engagement with the DUT 10. Since the criteria for spacing of the pads (as demonstrated in FIG. 3) are the same in each of the two directions of the pad array (relative to the two directions of the test point layout), each test point 12 is ensured of contacting at least one pad 20. However, this arrangement may also result in one test point 12 being contacted by a number of different pads 20, the maximum number being determined by the separation of the pads as compared with the size of that particular test point 12. This condition is demonstrated by FIG. 4 in which different test points 12 are contacted by different numbers of probe pads 20. As the width of a particular test point 12 in a particular direction approaches the separation of the pads 20 in that direction, the number of pads 20 which will contact that test point decreases. Similarly, as the width of the test points 12 increases away from the separation of the probe pads 20, the number of pads per test point 12 increases.

It should be apparent that the necessary minimum and maximum relative distances apply individually for each of the two directions of the pad array. If the two directions of the pad array were, for example, labelled the "X" and "Y" directions, the width of each probe pad 20 in the X direction must be smaller than the minimum distance between test points 12 only in the X direction and not in the Y direction. Similarly, the distance between adjacent probe pads 20 in the X direction must be smaller than the minimum width of each test point only in the X direction and not in the Y direction. Thus, if the known minimum dimensions of and between the test points 12 of all the DUTs to be tested are known for each of the X direction and the Y direction, the corresponding dimensions of the probe pad array in the X and Y directions only have to satisfy the stated requirements for their own respective directions. In the preferred embodiment, both directions on the pad array have the same minimum dimensions so that the fixture can be used for unknown DUTs 10 regardless of whether they are placed in the fixture in a first orientation or at 90° relative thereto. This, of course, is subject to the requirement that for each DUT tested, the density of the probe pad array is high enough to ensure contact with test points at all possible misalignment positions.

It should also be noted that in FIG. 4, the test points 12 are not in any particular organized arrangement. Instead, they are located where most convenient for the particular architecture of the DUT 10. Thus, there are many pads 20 of the fixture 16 which do not make contact with a test point 12. Furthermore, some test points are contacted by only one pad 20, while others are contacted by as many as six. It is typical for a DUT to have its test points unequally distributed in this manner, and the distribution of test points 12 may be different for different DUTs 10. Nonetheless, the same probe fixture 16 may be used for those DUTs, provided the relative density of the probe pad array is sufficient, as previously discussed.

In the preferred embodiment of the invention, the separation of the remote contacts 22 is wider than the minimum pitch of the test points 12. This allows for simplified probing of each individual electrical signal by manual probing of the remote contacts 22. However, in automated test procedures, the probe fixture must be brought into engagement with a DUT and the appropriate signals measured by automated test equipment. With the probe fixture of the present invention, it is therefore necessary to determine which of the remote contacts bear which of the desired signals. This determination may be made by manual measurements of signals at the remote contacts, or automatically in a number of different ways.

As shown in FIG. 2, each remote contact 22 of fixture 16 is contacted by a corresponding contact of multiplexer unit 15, which is in turn connected to a switch of a switch array. These may take the form of multiplexed relays. Before any testing of the DUT circuitry begins, it is necessary to sequentially test the connection status of the different probes by changing the position of the switches and thereafter measuring any signal which each may carry. This switching and measuring is controlled by controller 17 and can take place in different known ways. A description follows of one possible method which may be used with the present embodiment.

Once physical contact is made between the DUT 10 and fixture 16, each probe pad 20 is tested for electrical continuity with adjacent probe pads. In the preferred embodiment, this is done by controller 17 issuing a signal to the fixture multiplexer unit 15 to simultaneously position two switches of its switch array to connect a test circuit of test circuitry 11 to remote contacts which connect to two adjacent probe pads 20. Once the multiplexer unit 15 is connected to the appropriate pads 20, the controller 17 signals the test circuit to test the relative electrical continuity of the selected probe pads via the switch connections. The test circuit may be any circuit capable of detecting a short circuit between the two probes, and in the preferred embodiment is a standard ohmmeter. The ohmmeter within test circuitry 11 determines whether a short circuit exists between the two tested probes, and it reports the result to the controller 17. The controller 17 has an internal memory unit and stores a representation indicative of whether a short circuit exists between the two probes 18 in question.

A short circuit between first and second adjacent probe pads 20 indicates to the controller 17 that those two probe pads are contacting the same test point 12. The absence of a short circuit between the two probe pads under test indicates to the controller 17 that the probe pads 20 are not in contact with the same test point 12, although each may be contacting a different test point. The controller controls the multiplexer unit 15 to allow the testing of the electrical continuity of each probe pad 20 with each of its immediately adjacent probe pads. The memory log of each of the short circuits between the pads which is thereby created by the controller 17 represents a map of which of the probe pads 20 are connected to the same test points 12.

The map of test points 12, as determined by the controller 17, may be used in various ways with regard to connecting the test circuitry. In the preferred embodiment, the relative location of the test points 12 on each of the different DUTs to be tested is known in advance, and is stored as a map in the memory unit of controller 17. When a particular DUT 10 is to be tested, a user provides an input to the controller 17 which indicates which of the DUT types is being tested. The controller then performs the switching and short circuit tests described above to determine the map of the probe pad connections. The generated probe pad map is then compared with the map of the test points 12 held in memory. Short-circuit interconnection of adjacent probe pads 20 in the vicinity of the expected locations of test points 12 (according to the stored map for that DUT) indicates to the controller actual connections between probe pads 20 and those test points 12. Slight misalignments between the DUT 10 and the fixture 16 may result in the test points 12 not contacting exactly those probe pads 20 which would have been expected if the alignment had been more precise. However, by comparing the two maps, the controller 17 determines which of the probe pads are actually making connection with the test points 12.

Once the controller has determined the actual connections between the probes and the test points 12, the controller 17 may then proceed with any test procedures which must be performed. The appropriate test circuitry is connected to the appropriate test points on the board by signalling multiplexer unit 15 to make the desired connections. Once the test procedure is complete, the vacuum or other force holding the DUT 10 to the fixture 16 is released, and the DUT is replaced with a new DUT 10 to be tested. If the new DUT is of a type different from the previous one, a user must indicate that to the controller 17 so that a new test point map for that DUT can be accessed.

It should be noted that in the preferred embodiment the density of the probe pads is much higher than the density of the test points. This ensures than in any relative lateral alignment of the DUT 10 and the fixture 16, at least two probe pads 20 contact each test point 12. Because at least two probe pads must contact each test point for the ohmmeter technique described above, embodiments of the invention in which a minimum of two probe pads per test point is not ensured must use an alternative method of determining which probe pads are in contact with the test points. One of these alternative methods is described below.

It may be desirable to use a method of determining the connections between the probe pads 20 and the test points 12 other than the ohmmeter method. For example, the tester might apply a first common potential to the board's ground and power nodes such that each of the test points 12 would have the same potential. The controller could then make connection to each of the probe pads individually and measure the potential difference between that pad and a second, different potential. Absence of a potential difference would indicate that the pad in question is "floating" and thus not in contact with a board test point, while the expected potential difference indicates contact. By then comparing these measurements with a stored representation of the board's test point layout, the controller 17 can determine which of the probe pads 20 is in electrical contact with which one of the test points. Obviously, different algorithms may be employed to simplify the signal correlation.

Since knowing the relative locations of the test points on the DUT 10 simplifies the determination of the probe pad connections, precise alignment of the DUT 10 with the fixture 16 further aids the determination process, since the locations of the test points 12 relative to the probe pads 20 will more closely correspond to their expected locations. For this reason, different methods of precisely aligning the DUT 10 with the fixture may be used with the present invention. In the preferred embodiment, the DUTs are designed with a point of reference on their surface generally referred to as a fiducial mark. Such a fiducial mark may be a physical obstruction detectable by optical means, or it may be an electrical node onto which a reference signal can be introduced without precisely aligning the test probes. All of the test points on the board are known to be precisely located relative to the fiducial mark. Therefore, once this point is located, the desired fine adjustments in test point alignment may be made. Location of the fiducial mark may be accomplished by any of a number of known methods. These may include detecting the location of the reference-signal-carrying node by probe contact or capacitive or inductive sensing or employing a laser alignment technique which responds to a fiducial mark of a visual or optically responsive nature.

While the invention has been particularly shown and described with reference to a preferred embodiment thereof, it will be understood by those skilled in the art that various changes in form and details may be made therein without departing from the spirit and scope of the invention as defined by the appended claims. As mentioned above, there might be fewer switches in the switch array of the multiplexer unit 15 than there are probe pads 20. For example, single-pole, multiple-throw switches could be used, each being arranged to contact two adjacent probes. If these switches were overlapped so that each probe could be contacted by at least two switches, any two pads could each be contacted by different switches simultaneously.

Figure 5:
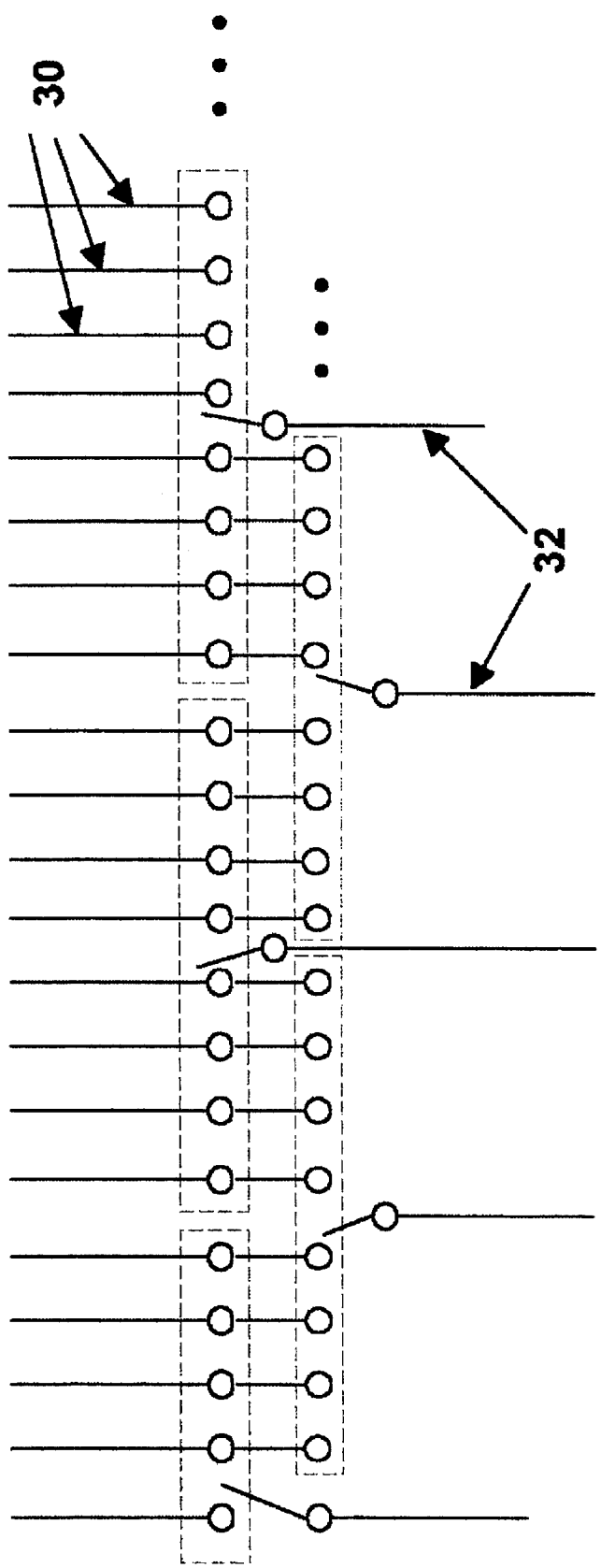
FIG. 5 is a schematic view of a portion of a multiplexer unit which may be used with the present invention.

FIG. 5 is a partial schematic of overlapped switches, the arm of each of which contacts eight probe pads on different switch contacts 30, except the arms of the switches on the sides, which each contact five. Each of the switch contacts is connected to one of the contacts of the multiplexer unit which makes electrical connection with a remote contact 22 of fixture 16. Each of the poles 32 on the opposite side of the switches connects to one of the links 13 between the multiplexer unit 15 and the test circuitry 11. In the Figure, poles of the same switch are enclosed within the same broken line border. Only the left side portion of the switch matrix is shown, but it will be understood that the switch matrix continues to the right for as many switches as required, and terminates on the other side with a five-pole switch so that the matrix is symmetrical.

This overlapping matrix structure is also continued in a second direction perpendicular to that shown in FIG. 5 to provide support for a two-dimensional array of multiplexer contacts. By having a similar row of overlapped switches for each row of probe pads, any two probe pads in the array could be contacted simultaneously, each by a different switch. Since there are many fewer test circuits than probe pads 20, it is desirable to provide this switchable contact between the test circuitry and the probe pads. The number of different tests is typically limited, and the tests conducted sequentially on different combinations of test points use the same test circuits repeatedly. Thus, a multiplexed reduction of connections simplifies contact with the test circuitry.

In another variation of the invention, the multiplexer unit 15 could be internal to the fixture 16. If the switches separated the pads 20 and the remote contacts 22 and were multiplexed as opposed to "one-to-one", there would be a reduction of remote contacts 22 relative to the pads 20. The fixture and multiplexer functions could then be combined in the fixture 16. Furthermore, in some instances it might be desirable to have separate switching functions in each of the multiplexer units 15 and the fixture 16. Such might be the case if different multiplexer units and test circuitry arrangements were used with different fixtures 16. Varying arrangements and numbers of remote contacts and multiplexer contacts could be accommodated by appropriate switching connections in both the multiplexer unit and the switches of the fixture.

I claim:

1. A circuit probing apparatus comprising:

an electrical device to be probed comprising a plurality of electrically conductive test points each test point having a width at least as great as a predetermined width and being spaced from one another by at least a predetermined minimum distance;

an array of electrical contacts to be electrically connected to the test points;

a probe fixture on which the electrical device is mounted comprising a plurality of probe pads that together contact all of the test points, each of the probe pads having a maximum width that is less than said predetermined minimum distance and being spaced from one another by a distance that does not exceed said predetermined width, such that at least one of the probe pads contacts each of the plurality of test points, and no one of the probe pads simultaneously contacts more than one test point, the probes being sized and dimensioned to accommodate a misalignment of the device and the probe fixture; and a switch matrix operable selectively to connect at least one of the electrical contacts to one of the probe pads.

2. A probing apparatus according to claim 1 wherein the switch matrix is operable to switch the connection of at least one of the electrical contact from one of the probe pads to another of the probe pads.

3. A probing apparatus according to claim 1 further comprising an electrical test circuit in electrical communication with the electrical contacts for providing and receiving electrical test signals to and from the electrical device via the probe fixture.

4. A probing apparatus according to claim 1 wherein the electrical device to be tested is a printed circuit board.

5. A probing apparatus according to claim 1 wherein the probe fixture further comprises a gasket which receives the electrical device and which surrounds the probe pads.

6. A probing apparatus according to claim 1 wherein the probe fixture further comprises a flexible surface to which the probe pads are mounted.

7. A probing apparatus according to claim 6 wherein the flexible surface comprises polyimide.

8. A probing apparatus according to claim 1 wherein the switching matrix is part of the probe fixture.

9. A circuit testing apparatus comprising:

a circuit board under test having a plurality of electrically conductive test points;

an electrical test circuit for transmitting and receiving electrical test signals to and from the circuit board under test;

a probe fixture for making connection between the test circuit and test points of the circuit board, the fixture comprising an array of probe pads with the probe pads arranged such that there is a greater density of probe pads than associated test points, the probe pads being sized and separated from one another such that throughout a range of lateral positions of the circuit board with respect to the probe pads, and when the circuit board is in a first of said lateral positions, a particular test point is in contact with a first one of said probe pads and, when the circuit board is in a second of said lateral position, said particular test point is in contact with a second one of the probe pads, but not in contact with the first one of the probe pads; and switching circuitry operable selectively to connect the test circuit to individual probe pads.

10. A testing apparatus according to claim 9 wherein the switching circuitry comprises a switching matrix external to the probe fixture.

11. A testing apparatus according to claim 10 wherein the switching matrix is a miltiplexed switching matrix.

12. A testing apparatus according to claim 9 further comprising a controller which generates signals received by the switching circuitry to cause particular connections to be established between the test circuit and the circuit board.

13. A testing apparatus according to claim 9 wherein each test point of the circuit board has a width at least as great as a predetermined width and is spaced from other test points by at least a predetermined minimum distance and wherein the probe pads of the probe fixture have a maximum width less than said predetermined minimum distance and are spaced from one another by a distance that does not exceed said predetermined width, such that each test points is contacted by at least one probe and no probe contacts more than one test point even with a misalignment between the device and the fixture.

14. A testing apparatus according to claim 13 wherein the probe pads are arranged in a substantially rectangular array.

15. A testing apparatus according to claim 9 wherein the switching circuitry is part of the probe fixture.

16. A method of probing an electrical circuit comprising:

providing an electrical device to be probed comprising a plurality of electrically conductive test points each test point having a width that is at least as great as a predetermined width and being spaced from one another by at least a predetermined minimum distance;

providing electrical contacts which are to be electrically connected to the test points;

providing electrical contact between the test points and the electrical contacts with a probe fixture on which the electrical device is mounted, the probe fixture comprising a plurality of probe pads that together contact all of the test points, the probe pads having a maximum width that is less than said predetermined minimum distance and being separated from one another by a distant that does not exceed said predetermined width, such that the probe pads contact all of the plurality of test points, and no one of the probe pads contacts simultaneously more than one test point; and selectively connecting at least one of the electrical contacts to one of the probe pads with a switch matrix.

17. A method according to claim 16 further comprising operating the switch matrix to switch the connection of at least one of the electrical contact from one of the probe pads to another.

18. A method according to claim 16 further comprising providing an electrical test circuit in electrical communication with the electrical contacts for transmitting and receiving electrical test signals to and from the electrical device via the probe fixture.

19. A method according to claim 16 wherein providing an electrical device to be tested comprises providing a printed circuit board.

20. A method according to claim 16 further comprising surrounding the probe pads with a gasket which receives the electrical device.

21. A method according to claim 16 further comprising a flexible surface on the fixture to which the probe pads are mounted.

22. A method according to claim 16 further comprising locating the switch matrix within the probe fixture.

23. A method of testing an electrical circuit comprising:

providing a circuit board under test having a plurality of electrically conductive test points;

providing an electrical test circuit for transmitting and receiving electrical test signals to and from the circuit board under test;

making connection between the test circuit and the test points of the circuit board with a probe fixture which comprises an array of probe pads in which the probe pads are arranged such that there is a greater density of probe pads than associated test points, the probe pads being sized and separated from one another such that throughout a range of lateral positions of the circuit board with respect to the probe pads, with the circuit board in a first of said lateral positions, a particular test point is in contact with a first one of said probe pads and, with the circuit board in a second of said lateral positions, said particular test point is in contact with a second one of the probe pads, but not in contact with the first one of the probe pads; and selectively connecting the test circuit to individual probe pads.

24. A method according to claim 23 wherein selectively connecting the test circuit to individual probe pads comprises connecting the test circuit to individual probe pads using a multiplexed switch matrix.

25. A method according to claim 24 further comprising a controller which generates signals received by the switching matrix to cause particular connections to be established between the test circuit and the circuit board.

26. A method according to claim 23 further comprising:

determining a predetermined width relative to which each test point of the electrical device has a width at least as great, and determining a predetermined minimum distance between any two test points; and limiting the arrangement of the probe pads such that each probe pad has a width less than the predetermined minimum distance and the probe pads are spaced from one another by a distance that does not exceed the predetermined width.

27. A circuit probing apparatus of claim 1 wherein the probe pads are sized and separated from one another such that, throughout a range of lateral positions of the device with respect to the probe pads, when the device is in a first of said lateral positions, a particular one of the test points of the device contacts a first one of the probe pads and, when the device is in a second of said lateral positions, the particular test point contacts a second one of the probe pads, but does not contact the first one of the probe pads.

28. A circuit testing apparatus of claim 9 wherein the probe pads are sized and spaced such that together the probe pads contact all of the plurality of test points, and no one probe pad simultaneously contacts more than one test point.

29. A method according to claim 16 wherein the step of providing electrical contact includes providing the probe pads such that when the electrical device is in a first lateral position within a range of lateral positions, a particular test point is in contact with a first one of the probe pads and, when the device is in a second lateral position within the range, the particular test point is in contact with a second one of the probe pads, but not in contact with the first one of the probe pads.

30. A method of testing an electrical circuit of claim 23 wherein the step of making connection between the test circuit and the test points of the circuit board further includes sizing and spacing the probe pads such that the probe pads together contact all of the plurality of test points, and no one of the probe pads simultaneous contacts more than one test point.

* * * * *